United States Patent
Mu

(10) Patent No.: US 10,804,494 B2
(45) Date of Patent: Oct. 13, 2020

(54) DISPLAY DEVICE, DISPLAY PANEL AND MANUFACTURING METHOD THEREOF

(71) Applicant: WUHAN CHINA STAR OPTOELECTRONICS SEMICONDUCTOR DISPLAY TECHNOLOGY CO., LTD., Wuhan, Hubei (CN)

(72) Inventor: Junying Mu, Guangdong (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 27 days.

(21) Appl. No.: 15/737,616

(22) PCT Filed: Nov. 23, 2017

(86) PCT No.: PCT/CN2017/112622
§ 371 (c)(1),
(2) Date: Oct. 25, 2018

(87) PCT Pub. No.: WO2019/090845
PCT Pub. Date: May 16, 2019

(65) Prior Publication Data
US 2019/0148671 A1    May 16, 2019

(30) Foreign Application Priority Data

Nov. 10, 2017  (CN) .......................... 2017 1 1125691

(51) Int. Cl.
*H01L 51/52* (2006.01)
*H01L 51/56* (2006.01)

(52) U.S. Cl.
CPC .......... *H01L 51/5256* (2013.01); *H01L 51/56* (2013.01)

(58) Field of Classification Search
None
See application file for complete search history.

(56) References Cited

U.S. PATENT DOCUMENTS 7,902,565 B2    3/2011  Katsuno et al.
2005/0285521 A1  12/2005  Menda
(Continued)

FOREIGN PATENT DOCUMENTS

CN    103904246 A    7/2014
CN    104103660 A    10/2014
(Continued)

*Primary Examiner* — Nilufa Rahim
(74) *Attorney, Agent, or Firm* — Hemisphere Law, PLLC; Zhigang Ma

(57) ABSTRACT

Disclosed are a display device, a display panel and a manufacturing thereof. The display panel includes a base layer, a first barrier layer, a buffer layer and a second barrier layer. The first barrier layer, the buffer layer and the second barrier layer are sequentially stacked on the base layer. The buffer layer is formed by at least two kinds of metal organics or by a mixture of the metal organics, and no reaction occurs between the metal organics. In this disclosure, the adhesion among the layers of the film package is strengthened, so that the layers of the film package will not easily separate and the TFE stress resistance of the film package will increase to prevent the film package from breaking. In addition, many kinds of reactants have their reactions simultaneously such that the production efficiency can be increased.

11 Claims, 2 Drawing Sheets

(56) References Cited

U.S. PATENT DOCUMENTS

2014/0132150 A1    5/2014  You
2014/0141191 A1*   5/2014  Lee .................... H01L 31/0481
                                                                428/76

FOREIGN PATENT DOCUMENTS

| CN | 104103764 A | 10/2014 |
| CN | 104167502 A | 11/2014 |
| CN | 105304685 A | 2/2016 |
| CN | 105977394 A | 9/2016 |
| CN | 106299153 A | 1/2017 |
| CN | 206451712 U | 8/2017 |

* cited by examiner

DISPLAY DEVICE, DISPLAY PANEL AND MANUFACTURING METHOD THEREOF

RELATED APPLICATIONS

The present application is a National Phase of International Application Number PCT/CN2017/112622, filed Nov. 23, 2017, and claims the priority of China Application No. 201711125691.8, filed Nov. 10, 2017.

FIELD OF THE DISCLOSURE

The disclosure relates to a display technology, and more particularly to a display device, a display panel and a manufacturing method thereof.

BACKGROUND

Compared with the current mainstream of liquid crystal display technology, the OLED display technology has a higher contrast, a wider color gamut, a better flexibility, a lighter weight, and is more energy-saving. In recent years, the OLED display technology is gradually used in smart phones, tablet PCs, smart watches, large curved TVs, white lighting devices, and other electronic devices.

OLED devices have many advantages, so they are prospective in the display field. However, in the OLED devices, the active metals used to be the cathode is sensitive to the moisture and the oxygen in the air, and it is easy for them to react with the moisture, which affects the charge injection. In addition, the organic materials in the OLED device may react with the moisture and the oxygen in the air, which worsens the performance of the OLED device and becomes the main reason that the life-time of the OLED is shortened. Thus, the package technology is important to the OLED devices. Currently, there are many package technologies of the OLED devices, such as the thin film encapsulation (TFE) technology, the glass cover (Glass) package technology and the glass frit (Frit) package technology. The Chemical Vapor Deposition (CVD) method and the Atomic Layer Deposition (ALD) method are often used for the package of the OLED devices, because they are simply and help to make lighter and thinner devices.

The ALD method is a major technology in making the flexible active-matrix organic light-emitting diode (AMOLED). One of the major ALD methods is that, the reactants are injected to one side of the substrate and evenly flow through the surface of the substrate, wherein the reactants are separated by the nitrogen. All of the gases are discharged from the other side of the substrate. One film having a constant thickness is produced per cycle, and the cycle number is determined by a required thickness. Another major ALD method is that, the reactants are sequentially provided from their nozzles. The reactants pass through the surface of the substrate and are sucked from the exhaust holes. Each cycle also includes a pulse with the nitrogen that is used to be the isolation between each two cycles. The substrate or the nozzles moves back and forth smoothly such that the reactants flow through the substrate. A film having a constant thickness is produced per cycle, and the cycle number is determined according to a required thickness.

One of the film package structures is composed of inorganic metal layers and organic buffer layers, and the inorganic metal layer and the organic buffer layer are alternately stacked. The inorganic metal layer is used to isolate the moisture, and the organic buffer layer is used to cover articles and buffer the stress generated during bending and folding of film package. The equations to prepare $AL_2O_3$ films and $ZeO_2$ films by the ALD method are that:

The metal precursor+the organic gene precursor=the metal organic (i.e. the buffer layer).

The metal precursor+the oxide precursor=the metal oxide (i.e. the barrier layer).

However, there will be few disadvantages. The organic buffer layer cannot entirely buffer the TFE stress so that the film may break. To avoid that, the preparation of films cannot be implemented simultaneously, which causes low production efficiency.

SUMMARY

The technical problem the present disclosure tends to solve is that, how to provide a display device, a display panel and a manufacturing method thereof that can increase the stress resistance of the film package and improves the production efficiency.

To solve the above technical problem, the disclosure provides an OLED display panel, and the OLED display panel includes a base layer, a first barrier layer, a buffer layer and a second barrier layer. The first barrier layer, the buffer layer and the second barrier layer are sequentially stacked on the base layer. The buffer is formed by at least two kinds of metal organics or by a mixture of the metal organics, and no reaction occurs between the metal organics.

Also, the disclosure provides an OLED display device, and the OLED display device includes a display panel. The display panel includes a base layer, a first barrier layer, a buffer layer and a second barrier layer. The first barrier layer, the buffer layer and the second barrier layer are sequentially stacked on the base layer. The buffer layer is formed by at least two kinds of metal organics or by a mixture of the metal organics, and no reaction occurs between the metal organics.

Moreover, the disclosure provides an manufacturing method of an OLED panel, and the manufacturing method of an OLED panel includes: preparing a base layer; and sequentially providing a first barrier layer, a buffer layer and the second barrier layer onto the base layer. The first barrier layer, the buffer layer and the second barrier layer are sequentially stacked on the base layer. The buffer layer is formed by at least two kinds of metal organics or by a mixture of the metal organics, and no reaction occurs between the metal organics.

In this disclosure, the film package includes at least two kinds of metal organics or a mixture of at least two kinds of metal organics, so that the adhesion among the layers of the film package can be strengthened. As a result, the layers of the film package will not easily separate, and the TFE stress resistance of the film package will increase to prevent the film package from breaking. In addition, many kinds of reactants have their reactions simultaneously such that the production efficiency can be increased.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

Combined with the figures, the specific structural and functional details of the embodiments of this disclosure are clear and completely described hereinafter. However, the disclosure can be embodied in many forms of substitution, and should not be interpreted as merely limited to the embodiments described herein. Based on the embodiments of this disclosure, other concerned embodiments that the person skilled in the art can obviously implement without creative effort are within the scope of this disclosure.

The disclosure provides an OLED display panel. The OLED display panel includes a base layer, a first barrier layer, a buffer layer and a second barrier layer. The first barrier layer, the buffer layer and the second barrier layer are sequentially stacked on the base layer. The buffer layer is formed by at least two kinds of metal organics or by a mixture of the metal organics, and no reaction occurs between the metal organics.

Figure 1:
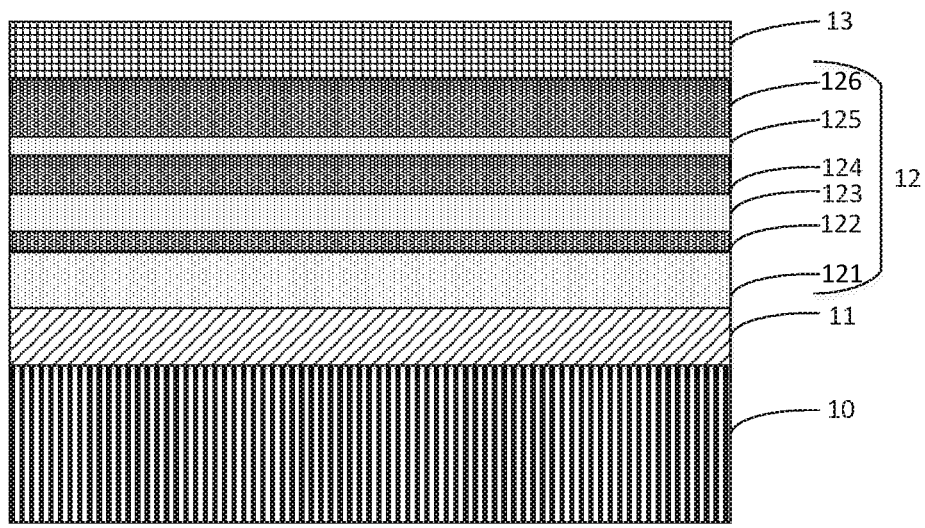
FIG. 1 is a structural schematic diagram of an OLED display panel according to the first embodiment of the disclosure.

A structural schematic diagram of an OLED display panel according to the first embodiment of the disclosure is shown in FIG. 1 to illustrate the structure of the OLED display panel.

As shown in FIG. 1, the OLED display panel includes a base layer 10, a first barrier layer 11, a buffer layer 12 and a second barrier layer 13. The first barrier layer 11, the buffer layer 12 and the second barrier layer 13 are sequentially stacked on the base layer 10.

The metal oxide forming the first barrier layer 10 and the second barrier layer 13 can be, for example, $Al_2O_3$, $TiO_2$ and $ZrO_2$. The buffer layer 12 is formed by a first metal organic and a second metal organic, and the first metal organic and the second metal organic will not react with each other. In other embodiments, the buffer layer 12 can be formed by three or more kinds of metal organic, and it is not limited thereto.

Part of the buffer layer 12 that contacts the first barrier layer 11 has metal elements which are same as metal elements that the first barrier layer 11 has, and part of the buffer layer 12 that contacts the second barrier layer 13 has metal elements which are same as metal elements that the second barrier layer 13 has. The organic and the oxide of the same metal have a better interfacial contact, so that in this disclosure, the adhesion among the layers of the film package can be stronger, which effectively avoids the layers of the film package partially separating from each other.

Again referring to FIG. 1, the buffer layer 12 includes a first metal-organic layer 121 and a second metal-organic layer 126. The first metal-organic layer 121 contacts the first barrier layer 11, and the first metal-organic layer 121 has a first metal element that the first barrier layer 11 also has. The second metal-organic layer 126 contacts the second barrier layer 13, and the second metal-organic layer 126 has a second metal element that the second barrier layer 13 also has.

In addition, a second metal-organic layer 122, a first metal-organic layer 123, a second metal-organic layer 124 and a first metal-organic layer 125 are sequentially stacked between the first metal-organic layer 121 and the second metal-organic layer 126. The first metal-organic layer 121, the first metal-organic layer 123 and the first metal-organic layer 125 are formed by the same material. The thickness of the first metal-organic layer 121, the thickness of the first metal-organic layer 123 and the thickness of the first metal-organic layer 125 gradually decrease along the direction from the first barrier layer 11 to the second barrier layer 13. The second metal-organic layer 122, the second metal-organic layer 124 and the second metal-organic layer 126 are formed by the same material. The thickness of the second metal-organic layer 122, the thickness of the second metal-organic layer 124 and the thickness of the second metal-organic layer 126 gradually increase along the direction from the first barrier layer 11 to the second barrier layer 13. Assumed that the Atomic Layer Deposition (ALD) method is used, one film having a constant thickness is formed per cycle. The cycle number is determined according to the required thickness. For example, the cycle number of the first metal-organic layer 121 is determined as 30, the cycle number of the second metal-organic layer 122 is determined as 10, the cycle number of the first metal-organic layer 123 is determined as 20, the cycle number of the second metal-organic layer 124 is determined as 20, the cycle number of the first metal-organic layer 125 is determined as 10, and the cycle number of the second metal-organic layer 126 is determined as 30.

In this embodiment, the first metal-organic layer and the second metal-organic layer are alternately stacked between the first barrier layer 11 and the second barrier layer 13. The total thickness of each two adjacent first metal-organic layer and second metal-organic layer is a constant. In other embodiments, the total thickness of each two adjacent first metal-organic layer and second metal-organic layer can be not a constant.

In other embodiment, the number of the barrier layers can be three or more. Also, among the barrier layers, there can be two, three, four, five or more buffer layers. Moreover, the cycle number is determined according to actual needs, and it is not limited thereto.

The OLED display panel can be used in any kind of display device.

According to the above descriptions, the film package provided in this embodiment includes at least two kinds of metal organic or a mixture of two kinds of metal organic. Thus, the adhesion among the layers of the film package is strengthened, so that the layers of the film package will not easily separate and the TFE stress resistance of the film package will increase to prevent the film package from breaking.

Figure 2:
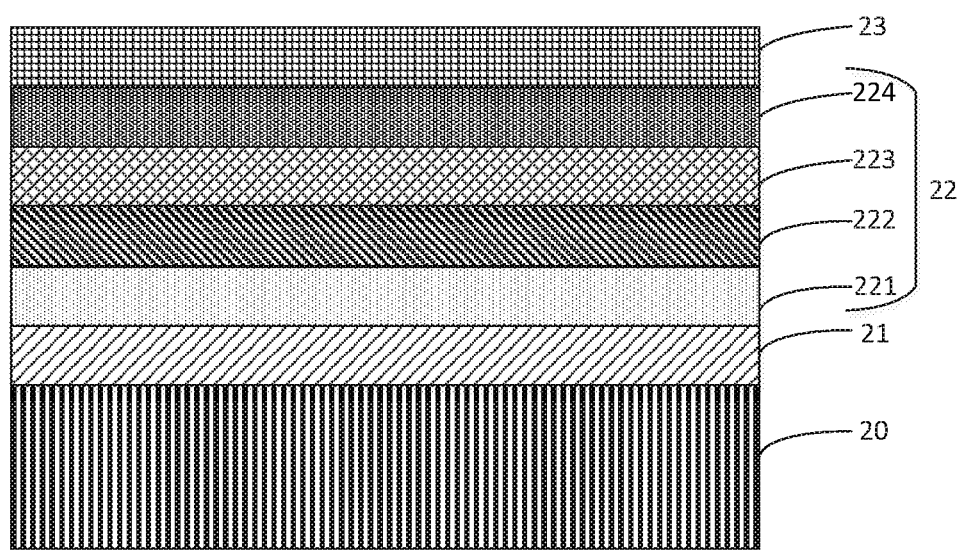
FIG. 2 is a structural schematic diagram of an OLED display panel according to the second embodiment of the disclosure.

Referring to FIG. 2, a structural schematic diagram of an OLED display panel according to the second embodiment of the disclosure is shown.

As shown in FIG. 2, the OLED display panel includes a base layer 20, a first barrier layer 21, a buffer layer 22 and a second barrier layer 23. The first barrier layer 21, the buffer layer 22 and the second barrier layer 23 are sequentially stacked on the base layer 20. The metal oxide forming the first barrier layer 20 and the second barrier layer 13 can be, for example. $Al_2O_3$, $TiO_2$ and $ZrO_2$. The buffer layer 22 is formed by a mixture of two kinds of metal organics, and these metal organics will not react with each other. In other embodiments, the buffer layer 22 can be formed by three or more kinds of metal organics, and it is not limited thereto.

Part of the buffer layer 22 that contacts the first barrier layer 21 has metal elements which are same as metal elements that the first barrier layer 21 has, and part of the buffer layer 22 that contacts the second barrier layer 23 has metal elements which are same as metal elements that the second barrier layer 23 has. The organic and the oxide of the same metal have a better interfacial contact, so that in this disclosure, the adhesion among the layers of the film package can be stronger, which effectively avoids the layers of the film package partially separating from each other.

Again referring to FIG. 2, the buffer layer 22 includes a first metal-organic layer 221 and a second metal-organic layer 224. The first metal-organic layer 221 contacts the first barrier layer 21, and the first metal-organic layer 221 has a first metal element that the first barrier layer 21 also has. The second metal-organic layer 224 contacts the second barrier layer 23, and the second metal-organic layer 224 has a second metal element that the second barrier layer 23 also has.

In addition, a first metal-organic mixture layer 222 and a second metal-organic mixture layer 223 are sequentially stacked between the first metal-organic layer 221 and the second metal-organic layer 224. The first metal-organic layer 221 is formed by a first metal organic, and the second metal-organic layer 224 is formed by a second metal organic. The first metal-organic mixture layer 222 and the second metal-organic mixture layer 223 are formed by a mixture of the first metal organic and the second metal organic, but the ratio of the first metal organic to the second metal organic in the first metal-organic mixture layer 222 is different from the ratio of the first metal organic to the second metal organic in the second metal-organic mixture layer 223. The contribution of the first metal organic gradually decreases and the contribution of the second metal organic gradually increases along a direction from the first metal-organic layer 221 to the second metal-organic layer 224. For example, 60% of the composition of the first metal-organic mixture layer 222 is the first metal organic, and 40% of the composition of the first metal-organic mixture layer 222 is the second metal organic. 40% of the composition of the second metal-organic mixture layer 223 is the first metal organic, and 60% of the composition of the second metal-organic mixture layer 223 is the second metal organic. In other embodiments, there can be three, four, five or more metal-organic layers formed between the first metal-organic layer 221 and the second metal-organic layer 224, as long as the contribution of the first metal organic gradually decreases and the contribution of the second metal organic gradually increases along a direction from the first metal-organic layer 221 to the second metal-organic layer 224.

In this embodiment, the thickness of the metal-organic layer equals to the thickness of the metal-organic mixture layer, and the total ratio of their metal organics are different. In other embodiments, the thickness of the metal-organic layer can be different from the thickness of the metal-organic mixture layer, and the total ratio of their metal organics can be equal.

It should be noted that, the equations for preparing the mixture in the buffer layer are:

The first metal precursor+the organic gene precursor=the first metal organic.

The second metal precursor+the organic gene precursor=the second metal organic.

According to the equations, two kinds of metal precursors that will not react with each other are required to prepare the metal-organic mixture layers. In this manner, two kinds of metal organics can be simultaneously prepared so that the production efficiency can be improved.

In other embodiment, the number of the barrier layers can be three or more. Also, among the barrier layers, there can be two, three, four, five or more buffer layer. Moreover, the contribution percentage of each metal organic in each layer can be determined according to needs, and it is not limited thereto.

The film package provided in this embodiment includes at least two kinds of metal organic or a mixture of two kinds of metal organic. Thus, the adhesion among the layers of the film package is strengthened, so that the layers of the film package will not easily separate and the TFE stress resistance of the film package will increase to prevent the film package from breaking.

The OLED display panel can be used in any kind of display device.

Figure 3:
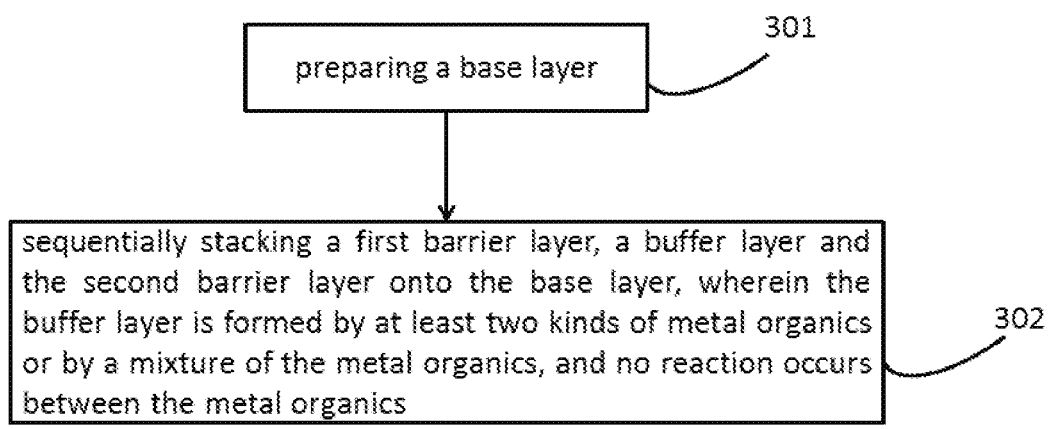
FIG. 3 is a flow chart of a manufacturing method of an OLED panel according to one embodiment of the disclosure.

Referring to FIG. 3, a flow chart of a manufacturing method of an OLED panel according to one embodiment of the disclosure is shown. As shown in FIG. 3, the manufacturing method of an OLED panel includes steps as follows.

Step S301: preparing a base layer.

Those skilled in the art should be familiar with the details about how to prepare the base layer, thus the relevant descriptions are omitted herein.

Step S302: sequentially stacking a first barrier layer, a buffer layer and the second barrier layer onto the base layer. The buffer layer is formed by at least two kinds of metal organic or by a mixture of the metal organic, and no reaction occurs between the metal organics.

In one embodiment, to form the first barrier layer, ingredients of at least two kinds of metal organics are sequentially and alternately provided according to a predetermined sequence for forming metal organic layers. The metal organic layer contacting the first barrier layer has metal elements same as metal elements the first barrier layer has, and the metal organic layer contacting the second barrier layer has metal elements same as metal elements the second barrier layer has. The buffer layer includes a first metal-organic layer and a second metal-organic layer. The first metal-organic layer contacts the first barrier layer, and the second metal-organic layer contacts the second barrier layer. Part of the buffer layer not contacting the first barrier layer and the second barrier layer is alternately formed by the first metal-organic layer and the second metal-organic layer. In the part of the buffer layer alternately formed by the first metal-organic layer and the second metal-organic layer, the thickness of the first metal-organic layer gradually decreases and the thickness of the second metal-organic layer gradually increases along a direction from the first barrier layer to the second barrier layer.

Preferably, the equation to prepare the first barrier layer by using its ingredients is that:

The first metal precursor+the oxide precursor=the first metal oxide (i.e. the first barrier layer)

When the first metal precursor and the oxide precursor are provided to prepare the first metal-organic layer, one film having a constant thickness is formed per cycle. The cycle number is determined according to the required thickness. For example, the cycle number of the first metal-organic layer can be set as 30, and the equation to prepare the first metal-organic layer is that:

The first metal precursor+organic gene precursor=the first metal organic (i.e. the first metal-organic layer).

Then, the ingredients for preparing the second metal-organic are provided, the cycle number of the second metal-organic layer can be set as 10, and the equation to prepare the second metal-organic layer is that:

The second metal precursor+organic gene precursor=the second metal organic (i.e. the second metal-organic layer).

After that, the steps are as follows.

The ingredients for preparing the first metal-organic are provided, and the cycle number of the first metal-organic layer can be set as 20.

The ingredients for preparing the second metal-organic are provided, and the cycle number of the second metal-organic layer can be set as 20.

The ingredients for preparing the first metal-organic are provided, and the cycle number of the first metal-organic layer can be set as 10.

The ingredients for preparing the second metal-organic are provided, and the cycle number of the second metal-organic layer can be set as 30.

The ingredients for preparing the second barrier layer are provided, and the equation to prepare the second barrier layer is that:

The second metal precursor+the oxide precursor=the second metal oxide (i.e. the second barrier layer).

It should be noted that, in other embodiments, the number of the barrier layers can be three or more. Also, among the barrier layers, there can be two, three, four, five or more buffer layers, as long as part of the buffer layer contacting the barrier layers has metal elements same as metal elements the barrier layers have. Moreover, the cycle number is determined according to actual needs, and it is not limited thereto.

In another embodiment, to form the first barrier layer, ingredients of at least two kinds of metal organics are sequentially and alternately provided according to a predetermined sequence for forming metal organic layers, and then a mixture of at least two kinds of the metal organics that is used to form the buffer layer on the first barrier layer is produced. The metal organics contacting the first barrier layer has metal elements same as metal elements the first barrier layer has, and the metal organic contacting the second barrier layer has metal elements same as metal elements the second barrier layer has. The buffer layer includes a first metal-organic layer and a second metal-organic layer. The first metal-organic layer contacts the first barrier layer, and the second metal-organic layer contacts the second barrier layer. Part of the buffer layer not contacting the first barrier layer and the second barrier layer is formed by a mixture of the first metal organic and the second metal organic. In the part of the buffer layer formed by a mixture of the first metal organic and the second metal organic, the contribution of the first metal-organic layer gradually decreases and the contribution of the second metal-organic layer gradually increases along a direction from the first barrier layer to the second barrier layer.

Preferably, the equation to prepare the first barrier layer by using its ingredients is that:

The first metal precursor+the oxide precursor=the first metal organics (i.e. the first barrier layer).

The equation to prepare the first metal-organic mixture layer by using its ingredients is that (wherein, in the ingredients used to prepare the first metal-organic mixture layer, the contribution percentage of the first metal organics is 60% and the contribution percentage of the second metal organics is 40%):

The first metal precursor+the organic gene precursor=the first metal organics.

The second metal precursor+the organic gene precursor=the second metal organics.

It should be noted that, no reaction occurs between the first metal precursor and the second metal precursor.

The equation to prepare the second metal-organic mixture layer by using its ingredients is similar to the equation to prepare the first metal-organic mixture layer by using its ingredients. However, in the ingredients used to prepare the second metal-organic mixture layer, the contribution percentage of the first metal organics is 40% and the contribution percentage of the second metal organics is 60%.

The equation to prepare the second metal-organic layer by using its ingredients is that:

The second metal precursor+the organic gene precursor=the second metal organics (i.e. the second metal-organic layer).

The equation to prepare the second barrier layer by using its ingredients is that:

The second metal precursor+the oxide precursor=the second metal oxide (i.e. the second barrier layer).

In this embodiment, the thickness of the metal-organic layer equals to the thickness of the metal-organic mixture layer, and the total ratios of their metal organics are equal. In other embodiments, the thickness of the metal-organic layer can be different from the thickness of the metal-organic mixture layer, and the total ratios of their metal organics can also be different.

In other embodiments, the number of the barrier layers can be three or more, and among the barrier layers, there can be two, three, or more buffer layer. Also, the contribution percentage of each metal organic can be determined according to needs, and it is not limited thereto.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. An OLED display panel, comprising:
   a base layer;
   a first barrier layer;
   a buffer layer; and
   a second barrier layer;
   wherein the first barrier layer, the buffer layer and the second barrier layer are sequentially stacked on the base layer;
   wherein the buffer layer comprises at least two kinds of metal organics, and no reaction occurs between the metal organics;
   wherein part of the buffer layer contacting the first barrier layer has metal elements same as metal elements the first barrier layer has, and part of the buffer layer contacting the second barrier layer has metal elements same as metal elements the second barrier layer has;
   wherein the buffer layer includes a first metal-organic layer and a second metal-organic layer, the first metal-organic layer contacts the first barrier layer and is made of a first metal organics of the at least two kinds of metal organics, the second metal-organic layer contacts the second barrier layer and is made of a second metal organics of the at least two kinds of metal organics, the first barrier layer is made of a first metal oxide, the second barrier layer is made of a second metal oxide, and part of the buffer layer not contacting the first barrier layer and the second barrier layer is made of a mixture of the first metal organics and the second metal organics.

2. The OLED display panel according to claim 1, wherein the buffer layer includes first metal-organic layers and second metal-organic layers alternately arranged along a direction from the first barrier layer to the second barrier layer, the part of the buffer layer contacting the first barrier layer is one of the first metal-organic layers contacting the first barrier layer, the part of the buffer layer contacting the second barrier layer is one of the second metal-organic layers contacts the second barrier layer.

3. The OLED display panel according to claim 2, wherein thicknesses of the first metal-organic layers gradually decrease and thicknesses of the second metal-organic layers gradually increase, along the direction from the first barrier layer to the second barrier layer.

4. The OLED display panel according to claim 1, wherein in the part of the buffer layer made of the mixture of the first metal organics and the second metal organics, the contribution of the first metal organics gradually decreases and the contribution of the second metal organics gradually increases along a direction from the first barrier layer to the second barrier layer.

5. An OLED display device, comprising:
 a display panel, including:
  a base layer;
  a first barrier layer;
  a buffer layer; and
  a second barrier layer;
  wherein the first barrier layer, the buffer layer and the second barrier layer are sequentially stacked on the base layer;
  wherein the buffer layer comprises at least two kinds of metal organics, and no reaction occurs between the metal organics;
  wherein part of the buffer layer contacting the first barrier layer has metal elements same as metal elements the first barrier layer has, and part of the buffer layer contacting the second barrier layer has metal elements same as metal elements the second barrier layer has;
  wherein the buffer layer includes a first metal-organic layer and a second metal-organic layer, the first metal-organic layer contacts the first barrier layer and is made of a first metal organics of the at least two kinds of metal organics, the second metal-organic layer contacts the second barrier layer and is made of a second metal organics of the at least two kinds of metal organics, and part of the buffer layer not contacting the first barrier layer and the second barrier layer is made of a mixture of the first metal organics and the second metal organics.

6. The OLED display device according to claim 5, wherein the buffer layer includes first metal-organic layers and second metal-organic layers alternately arranged along a direction from the first barrier layer to the second barrier layer, the part of the buffer layer contacting the first barrier layer is one of the first metal-organic layers contacting the first barrier layer, the part of the buffer layer contacting the second barrier layer is one of the second metal-organic layers contacts the second barrier layer.

7. The OLED display device according to claim 6, wherein thicknesses of the first metal-organic layers gradually decrease and thicknesses of the second metal-organic layers gradually increase, along the direction from the first barrier layer to the second barrier layer.

8. The OLED display device according to claim 5, wherein in the part of the buffer layer made of the mixture of the first metal organics and the second metal organics, the contribution of the first metal organics gradually decreases and the contribution of the second metal organics gradually increases along a direction from the first barrier layer to the second barrier layer.

9. A manufacturing method of an OLED panel, comprising:
 preparing a base layer; and
 sequentially providing a first barrier layer, a buffer layer and a second barrier layer onto the base layer;
 wherein the first barrier layer, the buffer layer and the second barrier layer are sequentially stacked on the base layer;
 wherein the buffer layer comprises at least two kinds of metal organics, and no reaction occurs between the metal organics;
 wherein the step of sequentially providing the first barrier layer, the buffer layer and the second barrier layer onto the base layer includes:
  forming the first barrier layer on the base layer; and
  according to a predetermined ratio, simultaneously providing ingredients of at least two kinds of the metal organics to form a mixture of at least two kinds of metal organics, wherein the metal organics are used to form the buffer layer on the first barrier layer;
  wherein the metal organics contacting the first barrier layer has metal elements same as metal elements the first barrier layer has, and the metal organics contacting the second barrier layer has metal elements same as metal elements the second barrier layer has.

10. The manufacturing method of an OLED panel according to claim 9, wherein the buffer layer includes a first metal-organic layer and a second metal-organic layer, the first metal-organic layer contacts the first barrier layer and is made of a first metal organics of the at least two kinds of the metal organics, the second metal-organic layer contacts the second barrier layer and is made of a second metal organics of the at least two kinds of the metal organics, the first barrier layer is made of a first metal oxide, the second barrier layer is made of a second metal oxide, and part of the buffer layer not contacting the first barrier layer and the second barrier layer is made of a mixture of the first metal organics and the second metal organics.

11. The manufacturing method of an OLED panel according to claim 10, wherein in the part of the buffer layer made of the mixture of the first metal organics and the second metal organics, the contribution of the first metal organics gradually decreases and the contribution of the second metal organics gradually increases along a direction from the first barrier layer to the second barrier layer.

\* \* \* \* \*